(12) United States Patent
Benjamin

(10) Patent No.: US 6,920,312 B1
(45) Date of Patent: Jul. 19, 2005

(54) RF GENERATING SYSTEM WITH FAST LOOP CONTROL

(75) Inventor: Neil Benjamin, East Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 528 days.

(21) Appl. No.: 10/038,133

(22) Filed: Jan. 2, 2002

Related U.S. Application Data

(60) Provisional application No. 60/294,885, filed on May 31, 2001.

(51) Int. Cl.[7] .............................. H04B 1/00; H04B 7/00
(52) U.S. Cl. .................. 455/69; 455/63.1; 455/571; 455/572; 455/574; 455/127.1; 455/127.5; 455/343.6; 330/149; 330/306; 330/66; 340/426.25; 340/428; 340/511; 340/521
(58) Field of Search .................. 455/69, 63.1, 126, 455/18, 574, 571, 572, 127.1, 127.5, 343.5, 343.6; 330/149, 306, 66; 340/426.25, 428, 511, 518, 521

(56) References Cited

U.S. PATENT DOCUMENTS

| | | | |
|---|---|---|---|
| 3,787,730 A | 1/1974 | Ray et al. | |
| 4,668,904 A | 5/1987 | Kupiainen | |
| 4,733,342 A | 3/1988 | Mueller et al. | |
| 4,794,338 A | 12/1988 | Roemer et al. | |
| 4,820,986 A | 4/1989 | Mansfield et al. | |
| 4,961,054 A | 10/1990 | Park et al. | |
| 5,017,871 A | 5/1991 | Mueller et al. | |
| 5,063,349 A | 11/1991 | Roemer et al. | |
| 5,066,914 A | 11/1991 | Vavrek et al. | |
| 5,079,503 A | 1/1992 | Siebold et al. | |
| 5,087,880 A | 2/1992 | Bruder et al. | |
| 5,105,153 A | 4/1992 | Mueller et al. | |
| 5,245,287 A | 9/1993 | Nowak et al. | |
| 5,270,657 A | 12/1993 | Wirth et al. | |
| 5,298,863 A | 3/1994 | Nowak et al. | |
| 5,451,878 A | 9/1995 | Wirth et al. | |
| 5,617,030 A | 4/1997 | Fischer et al. | |
| 5,643,364 A | 7/1997 | Zhao et al. | 118/723 E |
| 5,663,647 A | 9/1997 | Wirth et al. | |
| 5,688,357 A | 11/1997 | Hanawa | 156/345 |
| 5,701,076 A | 12/1997 | Schmitt et al. | |
| 5,747,935 A | 5/1998 | Porter et al. | 315/111.51 |
| 5,818,580 A * | 10/1998 | Murnick | 356/311 |
| 5,889,252 A | 3/1999 | Williams et al. | 219/121.54 |
| 6,027,601 A | 2/2000 | Hanawa | 156/345 |
| 6,046,641 A | 4/2000 | Chawla et al. | 330/277 |
| 8,109,206 * | 8/2000 | Maydan et al. | 118/723 IR |
| 6,201,395 B1 | 3/2001 | Stanley | |
| 6,313,584 B1 * | 11/2001 | Johnson et al. | 315/111.21 |
| 6,351,683 B1 * | 2/2002 | Johnson et al. | 700/121 |
| 6,440,866 B1 * | 8/2002 | Collins et al. | 438/714 |
| 6,535,785 B2 * | 3/2003 | Johnson et al. | 700/121 |
| 6,552,448 B1 | 4/2003 | Gegner et al. | |
| 6,589,437 B1 * | 7/2003 | Collins | 216/68 |

\* cited by examiner

*Primary Examiner*—Marceau Milord
(74) *Attorney, Agent, or Firm*—Brinks Hofer Gilson & Lione

(57) ABSTRACT

An RF generating system operates with high efficiency to supply RF output power to a plasma load. The RF generating system is capable of modulating the RF output power at frequencies up to the frequency of the RF output power while maintaining high efficiency operation. Broadband frequency modulation of the RF output power suppresses instabilities thereby minimizing unstable behavior of the plasma load.

51 Claims, 4 Drawing Sheets

RF GENERATING SYSTEM WITH FAST LOOP CONTROL

This application claims the benefit pursuant to 35 U.S.C. §119(e) of Provisional U.S. patent application Ser. No. 60/294,885 filed on May 31, 2001.

FIELD OF THE INVENTION

The present invention relates to RF power generation to create and maintain a plasma and, more particularly, to an RF generating system with an RF output stage which may be modulated to minimize instabilities.

BACKGROUND

Material processing using plasma is a well-known technique. Processing is performed on a workpiece such as glass plates, semiconductor wafers or metal substrates. The processing may involve modification of a surface of the workpiece using the plasma, deposition of a thin film on the surface, and/or etching the film with the plasma. Gas plasma is formed through electrical excitation of a gas to produce electron-ion pairs.

In general, systems for material processing with plasma typically include a plasma chamber containing, or adjacent to, a plasma source powered by a radio frequency (RF) generator. In this type of system, the workpiece and the gas are placed in the plasma chamber and power is supplied to the gas by the RF generator via an antenna or electrode. A typical plasma generator is an RF power supply operating at an RF frequency of, for example, 100 kHz–100 MHz and an application-specific power level. RF power supplied by the RF generator excites the gas to form a plasma load.

During operation, the RF generator continuously delivers RF power. The RF power may be modulated in an attempt to sustain the plasma load in a discharge state by maintaining an equilibrium operating point. Modulation of the delivered RF power, however, may modulate the plasma load but not necessarily in a linear fashion. Accordingly, modulation of the plasma load is usually not desirable (unless operating in a pulsed mode) but may arise as a result of instabilities in the RF generator, the plasma load or the combined response of the RF generator and the plasma load.

Some instabilities of the plasma may be a result of the impedance of the plasma load. The plasma load impedance may interact with the dynamic output impedance of the RF generator at one or more frequencies to produce unstable positive loop gain. The unstable positive loop gain has the effect of allowing minor perturbations from the equilibrium operating point to significantly affect the RF power supplied by the RF generator. As a result, plasma extinguishment or oscillatory behavior of the plasma may occur. Unstable positive loop gain is typically easier to control in an RF generator that includes a linear power amplifier as the output stage, due, in part, to the wide modulation bandwidth possible. Conversely, in RF generators that include a non-linear switching power amplifier as the output stage, the complex pole-zero response restricts the available modulation bandwidth and makes control more difficult.

In prior art systems, well-known techniques that may provide some suppression of such instabilities include modification of the length of a coaxial cable connecting the RF generator and the plasma chamber and/or impedance matching networks with fixed or variable impedance. Another prior art technique involves the use of a power sensor. The power sensor is employed in a feedback control scheme to control the RF output power of an RF generator that includes a switch-mode power amplifier output stage. Such a feedback control scheme may operate with a frequency response up to about 10 kHz, although 1 or 2 kHz is more typical. Through control of the RF output power, nascent instabilities of the plasma impedance may be dominated to ensure the effective gain of any oscillation of the plasma impedance is below unity. By maintaining oscillations below unity gain, a metastable operating point may be formed around the equilibrium operating point.

Known problems in the prior art techniques and systems involve the inability to track and address instabilities occurring at frequencies higher than the modulation bandwidth of the RF generator. This is especially true when a switching power amplifier is used as the output stage of the RF generator. In general, the more efficient the power amplifier, the more opportunity for unstable operation with unmatched impedance and/or highly non-linear loads such as the plasma load.

Prior art systems and techniques for controlling instabilities lack sufficiently fast frequency response to react quickly enough to high frequency changes in the impedance of the plasma load. Impedance matching networks are limited to the speed at which the variable impedance components (or the frequency of the RF generator) may be adjusted. Similarly, feedback control schemes utilizing a power sensor are unable to track and react quickly enough to high frequency changes in the RF power. Often, the control response bandwidth may be directly limited by the rate at which the RF output power may be modulated. In fact, attempting feedback control near the bandwidth limit of the RF generator with prior art techniques may increase instability due to strong phase shifts in the output phase of the RF power near the bandwidth limit frequency. As such, changes in the impedance of the plasma load using delivered RF power may create instability that causes undesirable oscillations and/or extinguishments near the bandwidth limit.

BRIEF SUMMARY

To alleviate the disadvantages of the prior art, a plasma processing system is disclosed that includes an RF generating system. The RF generating system is operable to respond quickly to changes in impedance of a load coupled to the RF generating system. In one embodiment, the RF generating system includes an RF output stage electrically coupled with a first power supply and a second power supply.

The first and second power supplies supply DC power for the RF output stage. The magnitude of DC power supplied to the RF output stage determines the amplitude of RF output power generated. The first and second power supplies may operatively cooperate to generate DC power for the RF output stage. The first and second power supplies may be electrically connected in series (voltage delivery mode) or in parallel (current delivery mode).

The first power supply may be a relatively high efficiency design with inadequate frequency response to dynamically stabilize the load on the RF generating system. The second power supply may be a faster responding device capable of frequency responses up to the frequency of the RF power being generated by the RF output stage. The first power supply may operate as a main power source to generate DC power as a function of an RF setpoint. The RF setpoint is a selectable operating point for the RF generating system that corresponds to a desired amplitude of RF output power.

The second power supply may be an auxiliary power source operating as a function of a feedback signal to boost (raise) and/or buck (lower) the DC power supplied by the first power supply. The feedback signal may provide indication of potentially unstable tendencies within the plasma processing system. The first power supply may provide high efficiency operation of the RF generating system. The second power supply may provide suppression of residual switching ripple, harmonics and other noise. In addition, the second power supply may provide the capability for fast, relatively small modulation of the DC power supplied to the RF output stage in response to the feedback signal.

During operation in the plasma processing system, the RF generating system may suppress instabilities, such as, for example, instabilities in the plasma. The instabilities may be suppressed through operation of a first control loop to modulate the DC power supplied by the first power supply as a function of the RF setpoint. In addition, a second control loop may modulate the DC power supplied by the second power supply as a function of the feedback signal.

The first control loop may operate with a relatively low frequency response to adjust the RF output power as a function of the RF setpoint. The second control loop may operate with a relatively high frequency response, up to the frequency of the RF output power, to modulate generation of the RF output power in opposition to any unstable tendencies. As such, the RF output power may be modulated in a region around the operating point to maintain the stability of plasma. Accordingly, the first and second power supplies may cooperatively operate to provide wide bandwidth, relatively small amplitude modulation capability for the RF output power, while maintaining overall operating efficiency.

With the fast feedback configuration of the second control loop, the modulation capability of the RF output stage may create a local metastable region at the operating point independent of the slope of the load impedance characteristic at that point. In other words, the fast feedback configuration may provide a mechanism for controlling the effective impedance of the plasma to suppress instabilities within the plasma processing system. As a result, fluctuations in the impedance of the plasma may be controlled by high frequency adjustments in the RF power to assist in maintaining the plasma in a stable operating region around the desired operating point.

In another embodiment, the RF generating system includes a first RF output stage and a second RF output stage. The first RF output stage may operate as the main power source for the RF generating system. The second RF output stage may operate as an auxiliary power source. The first RF output stage may generate RF power with high efficiency and relatively low frequency response to maintain the operating point as a function of the RF setpoint. The second RF output stage may generate RF power with a high frequency response, up to the frequency of the RF power, as a function of a feedback signal. The RF power generated by the second RF output stage may modulate the RF power generated by the first RF output stage. The RF power from the first and second RF output stages may be combined by a combiner and provided as the RF output power to the plasma load.

Other features and advantages of the invention will be apparent from the drawings and the more detailed description of the invention that follows. The foregoing discussion of the presently preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

The presently preferred embodiments provide a method and system for maintaining stability within a plasma processing system. The plasma processing system includes an RF generating system supplying RF power for a plasma discharge. The plasma discharge may be formed and/or biased by the RF power generated by the RF generating system. The RF generating system may vary the amplitude of the RF power to maintain the stability of the plasma processing system. During operation, the RF generating system may modulate the level of the RF power at frequencies up to the frequency of the RF power. Adjustment of the RF power may occur fast enough to minimize unstable tendencies that may create undesirable variations in the impedance of the plasma discharge. As such, the plasma processing system may be maintained in a stable operating range.

Figure 1:
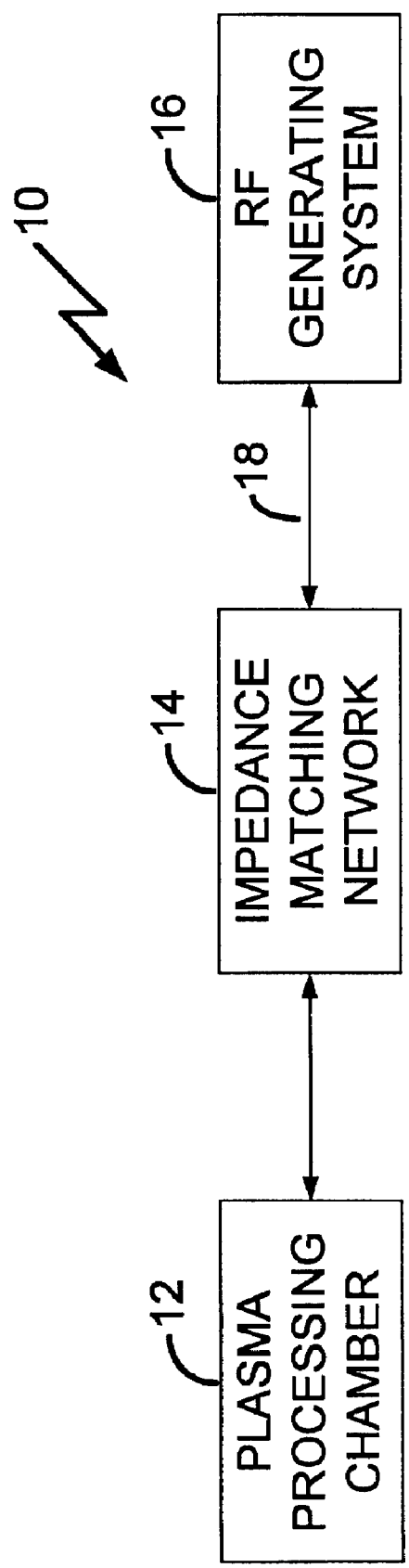
FIG. 1 is a block diagram of one embodiment of a plasma processing system.

FIG. 1 illustrates a plasma processing system 10 that includes a plasma-processing chamber 12, an impedance matching network 14 and an RF generating system 16 electrically coupled as illustrated. The plasma processing system 10 is operable to generate a plasma discharge. The plasma discharge, or plasma, may be defined as a collection of ionized atoms or molecules, electrons and neutral gas species. The plasma discharge is generated in the plasma-processing chamber 12.

The plasma-processing chamber 12 may be any device for providing surface modification, plasma-enhanced etching and/or plasma deposition on a workpiece. The plasma-processing chamber 12 may use any conventional coupling technique to create and maintain the plasma discharge. The plasma may be created using RF power coupled into the plasma processing chamber 12 by, for example, electrodes for capacitive coupling, a coil for inductive coupling and/or an antenna for electromagnetic coupling. During operation, the plasma discharge is maintained by supplying a material, such as an electronegative gas, that may be excited by the RF power within the plasma-processing chamber 12.

RF power is supplied to the plasma-processing chamber 12 from the impedance matching network 14. The impedance matching network 14 may be any conventional impedance matching system. Exemplary well-known impedance matching systems include a fixed impedance matching system and a variable impedance matching system. In one embodiment, the impedance matching network 14 may be direct coupled with the plasma-processing chamber 12. In another embodiment, the impedance matching network 14 may be electrically coupled with the plasma-processing chamber 12 by a coaxial cable or other transmission line. During operation, the impedance matching network 14 operates to match the impedance of the plasma discharge to the impedance of the RF generating system 16.

The RF generating system 16 is electrically connected with the impedance matching network 14 by an RF power node 18. The RF power node 18 may be a coaxial cable or any other form of transmission line capable of conducting RF power. In an alternative embodiment the RF generating system 16 may be close coupled to the impedance matching network 14 by the RF power node 18. In this embodiment, the RF power node 18 may be, any conductive material capable of conducting RF output power from the RF generating system 16 to the impedance matching network 14.

During operation, the impedance of the plasma discharge may be prone to instability. The impedance may vary as a function of the density of the plasma. Fluctuations of the plasma impedance may occur at frequencies higher than the impedance matching network 14 is capable of accommodating. When such fluctuations occur, the output impedance of the RF generating system 16 may no longer be matched to the load impedance resulting in modulation of the RF power delivered to the plasma. The modulation in the RF power results in further variation in the density of the plasma. As the density of the plasma varies, absorption of the RF output power by the plasma correspondingly varies. As such, variation in the density of the plasma affects stable operation and may lead to instability and/or extinguishment of the plasma discharge.

The presently preferred embodiments maintain stability by adjusting the amplitude of the RF output power as a function of potentially unstable tendencies within the plasma processing system 10. The RF output power may be modulated at frequencies up to the frequency of the RF output power by the RF generating system 16. Control of the RF power delivered to the plasma may assist in maintaining the stability of the plasma. For example, as the impedance of the plasma begins to increase (e.g. the density decreases), the RF generating system 16 may increase the amplitude of the RF power delivered. Conversely, decreases in the impedance may be corrected by decreases in the RF power delivered. Since adjustment of the RF output power may occur at frequencies up to the frequency of the RF output power, the stability of the impedance of the plasma may be maintained in a region surrounding a desired operating point.

Figure 2:
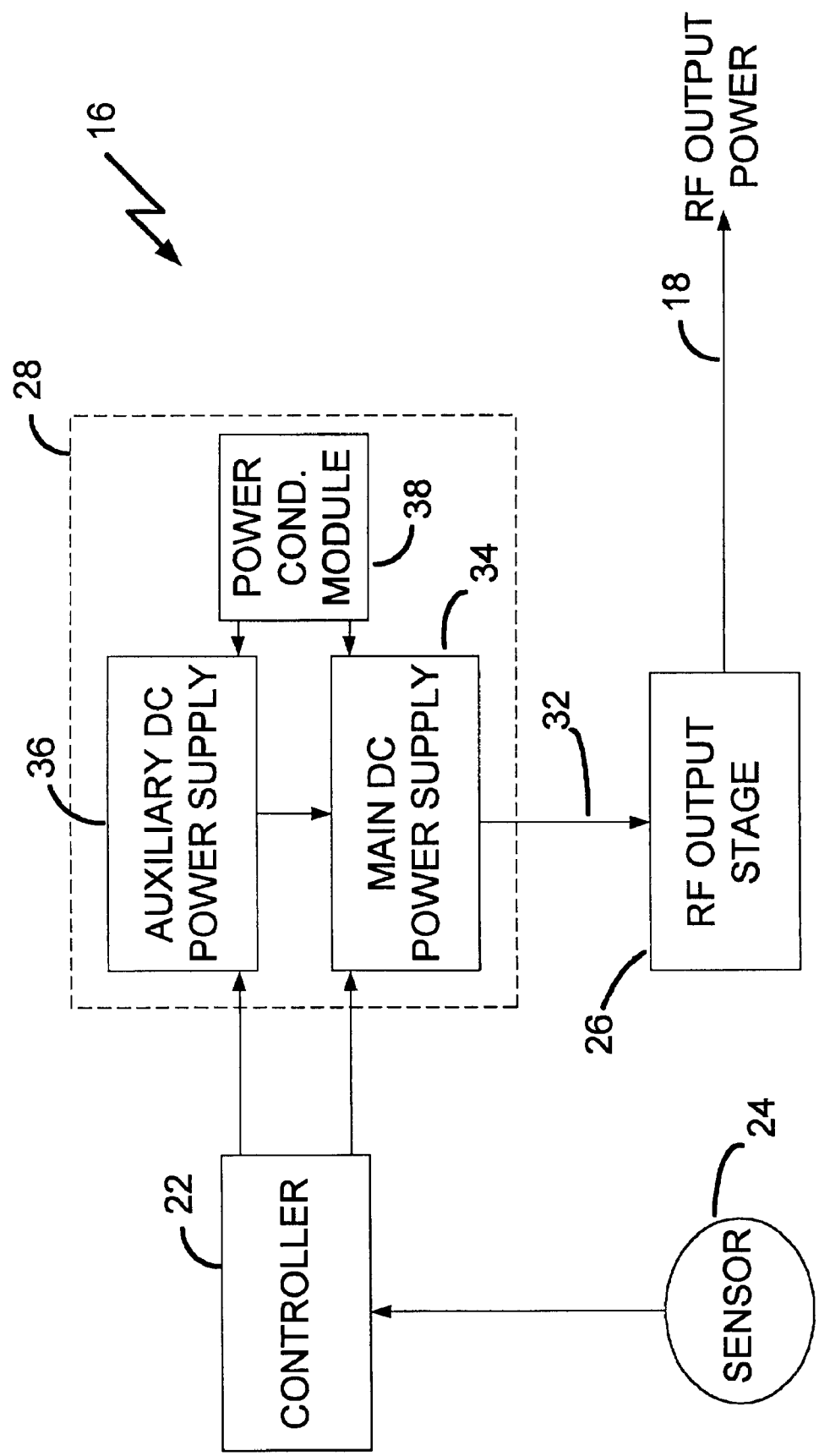
FIG. 2 is an expanded block diagram of a portion of the plasma processing system illustrated in FIG. 1 depicting an embodiment of an RF generating system.

FIG. 2 is a block diagram of one embodiment of the RF generating system 16. The RF generating system 16 includes a controller 22, at least one sensor 24, an RF output stage 26 and a direct current (DC) power supply 28 electrically connected as illustrated. The RF output power supplied on the RF power node 18 by the RF output stage 26 is controlled by the controller 22.

The controller 22 may be a central processing unit, a microprocessor, an integrated circuit, analog/digital hardware or any other device(s) capable of performing logic operations, sensing input signals and generating output signals. The controller 22 monitors and controls the operation of the RF generating system 16. Monitoring and control by the controller 22 may be a function of an RF setpoint.

The RF setpoint of one embodiment is generated by the controller 22 to provide a desired operating point for the RF generating system 16. Determination of the RF setpoint may be the result of externally provided control signals, such as for example, one or more feedback and/or feed forward signals supplied to the controller 22. The RF setpoint may also be determined utilizing control parameters within the controller 22 and/or any other parameter(s) indicative of operation. In addition, determination of the RF setpoint may include considerations such as, for example, efficiency, stability and/or any other process based parameters. The RF setpoint is a selectable operating point for the RF generating system 16 that corresponds to a desired amplitude of RF power.

The controller 22 may also process control signals for functions such as, for example, those pertaining to parametric control of tuning, gain or any other control related functions. In addition, the controller 22 may perform functions related to operation, such as, for example, generation of metrics indicating degree of instability of the plasma, control effectiveness, RF power levels, etc. In the illustrated embodiment the controller 22 is located within the plasma processing system 10. In other embodiments, the controller 22 may be located outside the plasma processing system 10.

The sensor 24 may be any type of sensor(s) capable of providing indication of unstable tendencies within the plasma processing system 10. For example, the sensor 24 may be one or more voltage sensors, power sensors, current sensors, temperature sensors and/or any other type of sensors for monitoring the RF power or other power/load related operating parameter(s). In addition, the sensor 24 may be one or more density measurement detectors, such as, for example, a Langmuir probe, optical detectors, harmonics detectors and/or any other device(s) for monitoring parameters related to the plasma discharge or other load supplied by the RF generating system 16. Further, the sensor 24 may include computational analysis, signal conditioning or any other form of adjustment of one or more operating parameters to provide indication of unstable tendencies.

The location of the sensor 24 may be anywhere within the plasma processing system 10 conducive to monitoring. In addition, an output signal from the sensor 24 may be provided to any device within the plasma processing system 10. In the illustrated embodiment, the output signal from the sensor 24 is provided as a feedback signal to the controller 22. In other embodiments, the feedback signal may be provided directly to the DC power supply 28 to further enhance frequency response. The bandwidth of the frequency response of the RF generating system 16 is dependent to some degree on the feedback response of the sensor 24. The sensor 24 preferably includes a frequency response approaching (or exceeding) the frequency of the RF output power provided by the RF output stage 26.

The RF output stage 26 is preferably some form of high efficiency switch-mode power amplifier, such as, for example, those manufactured by Advanced Energy of Fort Collins, Colo. or MKS/Applied Science and Technology Inc. of Boston, Mass. In other embodiments, however, the RF output stage 26 may be a linear power amplifier or any other device capable of generating RF power. Operation of the presently preferred RF output stage 26 provides high efficiency amplification (e.g. low power dissipation) through switch-mode operation at high frequency to produce the RF output power. The RF output stage 26 may produce an RF wave at a fixed frequency such as, for example, 2.0 MHz, 4.0 MHz, 13.56 MHz, 27.12 MHz, or 40.68 MHz. In other embodiments, the RF output stage 26 may generate a variable frequency RF wave. In the presently preferred embodiments, the RF output stage 26 may produce an RF wave at a frequency in the range of 100 kHz to 100 MHz.

The amplitude of the RF output power supplied by the RF output stage 26 may be controlled by, for example, pulse width modulation, "DC" power modulation or any other technique for modulating the amplitude of the RF output power. In the presently preferred embodiments, the amplitude is controlled by the magnitude of "DC" power present on a DC power rail 32. The "DC" power may be modulated to control amplification by the RF output stage 26.

As used herein, the terms "modulate," "modulation," or "modulated" refer to adjustment or variation in the magnitude of a parameter and does not pertain to frequency modulation (FM) or other signal variations of a carrier wave transmitting intelligence. Further, it should be understood that the "DC" power on the DC power rail 32 is unipolar and generally not time invariant direct current power. Instead, the "DC" power may be modulated at any frequency up to the frequency of the RF output power. In one embodiment, the RF output stage 26 includes an output filter with a quality factor (Q). The quality factor (Q) is the ratio of the energy stored by the output filter to the energy transmitted by the output filter, and may therefore require tuning to avoid undesirable limitation of the modulation bandwidth. Generation and modulation of the "DC" power on the DC power rail 32 is performed by the DC power supply 28.

One embodiment of the DC power supply 28 includes a first power supply that is a main DC power supply 34, a second power supply that is an auxiliary DC power supply 36 and a power conditioning module 38 electrically connected as illustrated in FIG. 2.

The main DC power supply 34 is preferably some type of high efficiency switch-mode amplifier. In general, switch-mode amplifiers achieve relatively high efficiency operation but may operate with relatively high distortion, reduced operating bandwidth and relatively low stability. In other embodiments, the main DC power supply 34 may be a linear power supply or any other type of DC power supply with a "DC" power output that may be modulated.

The auxiliary DC power supply 36 may be any broadband power amplifier. In the presently preferred embodiments, the auxiliary DC power supply 36 is a linear DC power supply such as, for example, a class A, class B or class AB amplifier. Generally, linear amplifiers may provide relatively high fidelity, a wider operating bandwidth and a greater degree of stability at the expense of relatively low efficiency. In other embodiments, the auxiliary DC power supply 36 may be any other form of high fidelity DC power supply with a wide operating bandwidth. The main DC power supply 34 and the auxiliary DC power supply 36 cooperatively operate to generate "DC" power for the DC power rail 32.

The power-conditioning module 38 may be any source of raw DC power for the main DC power supply 34 and the auxiliary DC power supply 36. As used herein, the term "raw" DC power identifies DC power that is unipolar and generally time invariant. The power-conditioning module 38 may perform rectification, filtering, regulation or any other conditioning during conversion of line power to raw DC power. The line power may be supplied to the power-conditioning module 38 from a power source such as, for example, an alternating current (AC) line, a battery, or any other source of power. Where line power is supplied from other than a DC source, the line power may be converted to raw DC power by the power-conditioning module 38 using conventional conversion techniques. An exemplary conversion is from AC to DC where the AC is rectified to form raw DC power. In another embodiment, the function performed by the power-conditioning module 38 may be performed by the main DC power supply 34 and/or the auxiliary DC power supply 36.

The "DC" power supplied by one embodiment of the main DC power supply 34 is the main "DC" supply for the RF output stage 26. As such, the main DC power supply 34 may be capable of providing from about 0 to 100% of the "DC" power used by the RF output stage 26 to generate from about 0 to 100% of the desired RF output power. Modulation of the main DC power supply 34 to generate and control the magnitude of "DC" power supplied to the DC rail 32 may be performed by conventional switching regulator techniques. Exemplary switching regulator techniques include controlling rectification of AC power to derive DC power directly from the power line, the use of a DC chopper and a high frequency transformer, or any other switching regulator based techniques.

In the presently preferred embodiment, the control method of the main DC power supply 34 may involve pulse width modulation (PWM) of raw DC power supplied by the power-conditioning module 38. In one embodiment, transistors within the main DC power supply 34 are activated and deactivated with a square wave. The square wave is pulse width modulated to control the magnitude of the "DC" power generated. As such, the transistors alternate between full on and full off forming a switch where the duty cycle of each switch is less than 50%. The square wave modulation frequency of one embodiment is about 1 MHz. In other embodiments, the frequency may be in any range from about 1 kHz up to about 2 MHz. The frequency allows control of the magnitude of the "DC" power throughout the intended operating range of the RF generating system 16 while maintaining stable control. The frequency response of the main DC power supply 34, however, may not be capable of sufficient frequency response to dynamically stabilize the plasma load under some circumstances.

In one embodiment, the main DC power supply 34 may be controlled with a first control loop. The first control loop includes the controller 22, the main DC power supply 34 and one or more feedback/feedforward signals indicative of the operation of the plasma processing system 10. As a function of the feedback/feedforward signals, the controller 22 generates the RF setpoint. In other embodiments, the first control loop may be multiple control loops and multiple feedback/feedforward signals operatively cooperating to generate the RF setpoint.

The first control loop, as a function of the RF setpoint, may control the magnitude of "DC" power generated by the main DC power supply 34. The magnitude of the "DC" power may correspond to the amplitude of RF output power desired from the RF output stage 26 (e.g., the operating point). In one embodiment, the RF setpoint determines the pulse width of the square wave used to control the magnitude of "DC" power generated by the main DC power supply 34. The first control loop may be considered a coarse control of the amplitude of the RF output power since the frequency response of the first control loop may be relatively low when compared to the frequency of the RF wave. As such, changes to the magnitude of the "DC" power supplied by the main DC power supply 34 may occur at a rate that is at least one order of magnitude less than the frequency of the RF wave.

In the presently preferred embodiments, the auxiliary DC power supply 36 may be any broadband linear power amplifier capable of adjusting the magnitude of an output signal that is otherwise similar to an input signal. In these embodiments, the adjustment in the magnitude may be a function of the magnitude of the input signal, or may be a function of the gain of the auxiliary DC power supply 36. In either case, the auxiliary DC power supply 36 may be capable of stable, linear, high frequency modulation of the magnitude of the "DC" power. As previously discussed, the "DC" power is unipolar and generally not time invariant direct current power.

The auxiliary DC power supply 36 of one embodiment may be controlled by the controller 22 to adjust the magnitude of the "DC" power supplied. In this embodiment, the controller 22 selectively varies the magnitude of a control signal supplied to the auxiliary DC power supply 36. The auxiliary DC power supply 36 provides fixed amplification gain independent of the amplitude of the control signal.

In another embodiment, the auxiliary DC power supply 36 may be a power version of an adjustable gain amplifier such as, for example, a programmable gain amplifier, or a multiplying digital-to-analog converter (DAC). In these embodiments, the auxiliary DC power supply 36 may be controlled as a function of a gain control signal supplied by the controller 22, the sensor 24 or any other source of gain control. As a function of the gain control signal, the auxiliary DC power supply 36 may adjust the amplification of the "DC" power.

The auxiliary DC power supply 36 may be controlled with a second control loop. In the illustrated embodiment, the second control loop includes the controller 22, the auxiliary DC power supply 36 and the sensor 24. The second control loop may operate to adjust the magnitude of "DC" power supplied from the auxiliary DC power supply 36 as a function feedback provide by the output signal of the sensor 24.

The magnitude of the "DC" power may be modulated by the second control loop at frequencies from below 1 kHz up to about the frequency of the RF wave. The frequency response and distortion characteristics of the auxiliary DC power supply 36 may allow modulation at frequencies up to the frequency of the RF wave without significant phase shifts or other similar distortion. As such, the auxiliary DC power supply 36 is a broadband amplifier performing fast, agile changes in the "DC" power to provide fine control of the amplitude of the RF output power. The range of modulation frequency of one embodiment is from time invariant DC up to about 1 MHz. Accordingly, the frequency response capability of the auxiliary DC power supply 36 may be at least one order of magnitude higher than the frequency response capability of the main DC power supply 34.

The auxiliary DC power supply 36 of one embodiment is a supplementary supply of "DC" power operating in support of the main DC power supply 34. In the presently preferred embodiments, the auxiliary DC power supply 36 provides a range of "DC" power that is a relatively small percentage of the "DC" power capability of the main DC power supply 34. The "DC" power supplied by the auxiliary DC power supply 36 may be in a restricted range. The restricted range may be sufficient to maintain the stability of the RF output power while being small enough to avoid significant degradation in the efficiency of the RF generating system 16.

In one embodiment, the auxiliary DC power supply 36 may provide between about −2.5 percent to +2.5 percent of the "DC" power required by the RF output stage 26. In other embodiments, the auxiliary DC power supply 36 may supply other percentages of "DC" power dependent on desired efficiency as well as the desired range of modulation capability. Accordingly, the magnitude of "DC" power available from the auxiliary DC power supply 36 may be at least one order of magnitude smaller than the magnitude of "DC" power available from the main DC power supply 34 to maintain efficiency while providing sufficient modulation capability.

As illustrated in the embodiment of FIG. 2, the main DC power supply 34 and the auxiliary DC power supply 36 are electrically connected in series and operate in voltage delivery mode. In the series configuration, either the main DC power supply 34 or the auxiliary DC power supply 36 may be floated on top of the other while maintaining a DC path through both. For example, the auxiliary DC power supply 36 may be grounded and the main DC power supply 34 may be electrically connected in series with the output of the auxiliary DC power supply 36. In another embodiment, the main DC power supply 34 and the auxiliary DC power supply 36 may be electrically connected in parallel and operate in current delivery mode.

Figure 3:
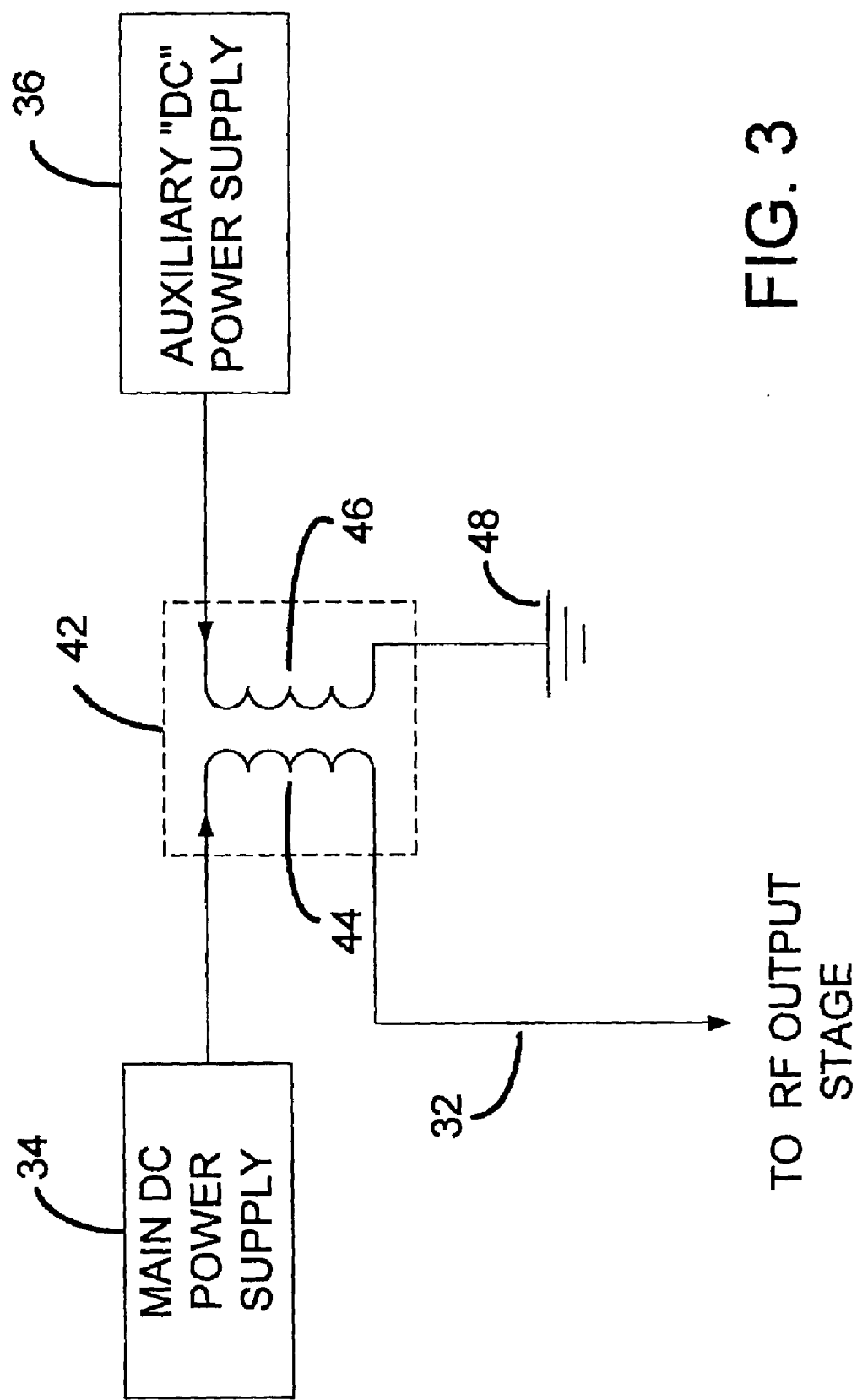
FIG. 3 is a schematic diagram illustrating the electrical coupling of an embodiment of a DC supply depicted in FIG. 2.

FIG. 3 illustrates another embodiment of a series configuration utilizing transformer coupling. In this configuration, a transformer 42 has a first winding 44 electrically connected with the main DC power supply 34 and a second winding 46 electrically connected with the auxiliary DC power supply 36. The first winding 44 may also be electrically connected with the DC rail 32 and the second winding 46 may be electrically connected with a ground connection 48. In this configuration, "DC" power from the main DC power supply 34 is adjusted by the high frequency modulation of the "DC" power from the auxiliary DC power supply 36. As such, the auxiliary DC power supply 36 contributes an AC modulation component to the "DC" power supplied by the main DC power supply 34 as illustrated by the quotes surrounding DC in FIG. 3.

The main DC power supply 34 and the auxiliary DC power supply 36 may be operated from the same power source since the transformer 42 provides isolation. Those skilled in the art would recognize that other forms of both series and parallel configurations are possible. In addition, other techniques for electrically combining the main DC power supply 34 and the auxiliary DC power supply 36 such as, for example, a bridge connection are possible in other embodiments.

Referring now to FIGS. 1 and 2, operation of the previously discussed RF generating system 16 within the plasma processing system 10 will be explained. During operation, the controller 22 may develop the desired operating point of the RF generating system 16 as the RF setpoint The RF setpoint may be provided to the first control loop. The first control loop may modulate the magnitude of the "DC" power supplied by the main DC power supply 34 to the DC rail 32 as a function of the RF setpoint. The magnitude of the "DC" power may be modulated at a relatively low frequency to efficiently generate a desired amplitude of RF output power from the RF output stage 26. The RF output power is provided through the impedance matching network 14 to the plasma-processing chamber 12. The RF output power may cause the ignition of gas within the plasma-processing chamber 12 and subsequently sustain/bias the resulting plasma discharge.

As instabilities create the potential for variation in the impedance of the plasma discharge, the second control loop may modulate the magnitude of the "DC" power supplied by the auxiliary DC power supply 36. Modulation of the "DC" power may occur at a response frequency up to the frequency of the RF wave. Modulation of the "DC" power from the auxiliary DC power supply 36 may modulate "DC" power present on the DC rail 32. Modulation of the DC rail 32 results in the modulation of the RF output power around the operating point. Modulation of the RF output power at frequencies up to the frequency of the RF wave may create a metastable operating region around the operating point. The metastable operating region may minimize instability of the dynamic impedance of the plasma.

Stabilizing the impedance of the plasma by quick and agile modulation of the RF output power may form the metastable operating region. As the first control loop may continue to modulate the operating point as a function of operating conditions, the second control loop may provide relatively small stabilizing modulation of the RF output power as a function of potentially destabilizing behavior present in the plasma processing system 10. Absent the auxiliary DC power supply 36, in the presently preferred embodiments, the main DC power supply 34 may not be capable of ensuring stability during high frequency variations in the impedance of the plasma. The incapability of this embodiment to ensure stability is due to the limited control loop bandwidth (e.g. frequency response) of the main DC power supply 34 acting alone.

The "DC" power supplied to the DC rail 32 is the "DC" power supplied by the main DC power supply 34 adjusted by the "DC" power supplied by the auxiliary DC power supply 36. The auxiliary DC power supply 36 may operate as a broadband power amplifier to buck or boost the "DC" power generated by the main DC power supply 34. The combination of the "DC" power supplied by the main DC power supply 34 supplemented by the "DC" power supplied by the auxiliary DC power supply 36 allows for wide bandwidth, high frequency response to instabilities within the plasma processing system 10 that may affect the stability of the plasma.

For example, consider the power requirements for a nominal 3000 watt, 13.56 MHz RF generating system 16. If the main DC power supply 34 were capable of supplying about 200 volts and 20 amps to the DC rail 32, the auxiliary DC power supply 36 may provide between about −5 volts and +5 volts at about 20 amps when the main DC power supply 34 and the auxiliary DC power supply 36 are operating in series. In another example, the main DC power supply 34 and the auxiliary DC power supply 36 are operating in parallel. In this example, the main DC power supply 34 is capable of supplying about 200 volts and 20 amps to the DC rail 32. As such, the auxiliary DC power supply 36 may provide about 200 volts and between about −0.5 amps and +0.5 amps. As illustrated by these examples, the auxiliary DC power supply 36 may add wide bandwidth, relatively small magnitude modulation capability to the "DC" power supplied by the main DC power supply 34.

Figure 4:
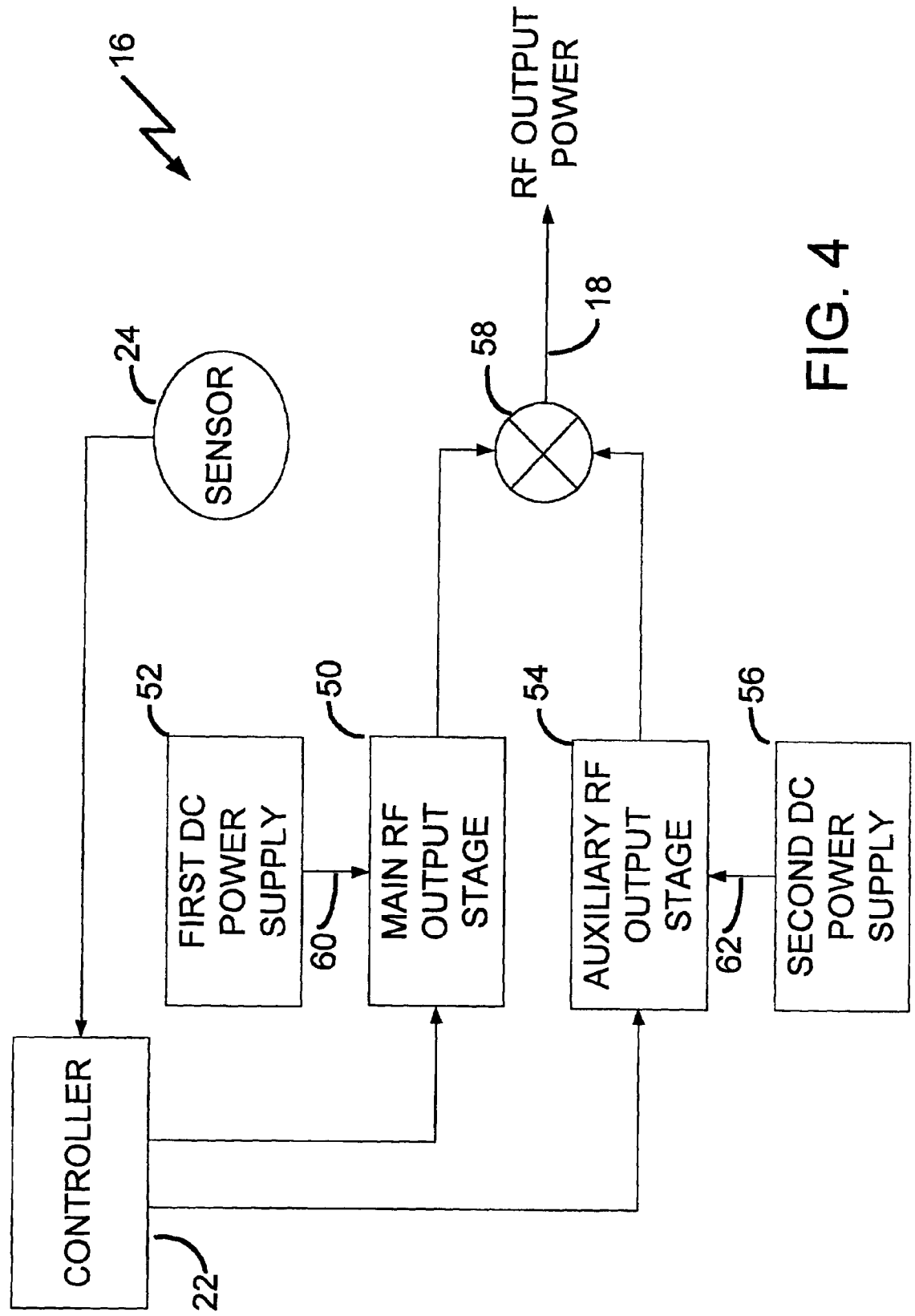
FIG. 4 is an expanded block diagram of a portion of the plasma processing system illustrated in FIG. 1 depicting another embodiment of an RF generating system.

FIG. 4 illustrates a block diagram of another embodiment of the RF generating system 16. In this embodiment, the RF generating system 16 includes the controller 22, the sensor 24, a first RF output stage that is a main RF output stage 50, a first DC power supply 52, a second RF output stage that is an auxiliary RF output stage 54, a second DC power supply 56 and a combiner 58 electrically connected as illustrated. Similar to the previous embodiments, the RF generating system 16 supplies RF output power. The RF output power may be provided to the RF power node 18, through the impedance matching network 14 (FIG. 1), and into the plasma processing chamber 12 (FIG. 1).

The main RF output stage 50 of this embodiment is similar to the previously discussed RF output stage 26 (FIG. 2). The main RF output stage 50 preferably includes a switch-mode power amplifier. In other embodiments, the power amplifier may be a linear power amplifier, or any other kind of amplifier capable of amplifying RF power. The main RF output stage 50 may be capable of supplying 0–100% of the RF power needed to form the plasma discharge. As such, the main RF output stage 50 is the main power supply for the RF generating system 16.

The presently preferred auxiliary RF output stage 54 may be any device capable of generating RF power with an amplitude agile power amplifier. The amplitude agile power amplifier may be, for example, a linear, or quasi-linear power amplifier such as a class A, class B, class AB, class C or class D amplifier. In other embodiments, the auxiliary RF output stage 54 may include any other form of amplitude agile amplifier capable of generating RF power. The auxiliary RF output stage 54 of one embodiment is preferably a class C or class D linear amplifier to maximize efficiency.

The auxiliary RF output stage 54 may perform as a supplementary supply of RF power operating in support of the main RF output stage 50. The RF power generation capability of the auxiliary RF output stage 54 may be a relatively small percentage of the RF power capability of the main RF output stage 50. As such, the RF power supplied by the auxiliary RF output stage 54 is at least one order of magnitude smaller than the RF power supplied by the main RF output stage 50. In one embodiment, the auxiliary RF output stage 54 is capable of supplying between about −2.5 and +2.5 percent of the RF power supply capability of the main RF output stage 50. It should be realized that the amplitude of RF power supplied by the auxiliary RF output stage 54 may be larger or smaller in other embodiments based on the preferred range of fast modulation capability and the desired efficiency.

In one embodiment, the main RF output stage 50 is supplied DC power from a first DC rail 60. The first DC rail 60 may be supplied DC power by the first DC power supply 52. A first control loop preferably controls the amplitude of the RF power supplied from the main RF output stage 50. In this embodiment, the first control loop includes the controller 22, the main RF output stage 50 and the RF setpoint. Similar to the previous embodiments, the controller 22 performs control and logic functions, and the RF setpoint is an operating point. The DC power on the first DC rail 60 of this embodiment, however, may be maintained at a relatively constant magnitude.

During operation, the controller 22 may operate the first control loop to modulate the amplitude of the RF power with pulse width modulation as a function of the RF setpoint. As such, the frequency response of the main RF output stage 50 may be relatively low such as, for example, 1 MHz or less. In other embodiments, the amplitude of the RF power may be adjusted by other modulation techniques such as, for example, modulation of the first DC power supply 52 or some other form of regulated switching.

The auxiliary RF output stage 54 may be supplied DC power from a second DC rail 62. The second DC rail 62 may be supplied DC power from the second DC power supply 56. In other embodiments, the first and second DC rails 60, 62 may be a single DC rail and/or a single DC power supply. The amplitude of the RF power generated by the auxiliary RF output stage 54 may be controlled with a second control loop. The second control loop of one embodiment includes the controller 22, the sensor 24 and the auxiliary RF output stage 54. In this embodiment, control of the auxiliary RF output stage 54 may be a function of the output signal from the sensor 24. As in the previous embodiments, the output signal may provide a feedback signal indicative of unstable tendencies within the plasma processing system 10. In addition, the second control loop operates with a frequency response up to the frequency of the RF power to modulate the RF power.

Modulation of the RF power supplied by the auxiliary RF output stage 54 may be accomplished by, for example, modulation of a drive signal, modulation of the gain, or modulation of the DC power. In the presently preferred embodiment, modulation of the DC power on the second DC rail 62 may control the amplitude of the RF power supplied by the auxiliary RF output stage 54. In other embodiments, any other technique for modulating the RF power supplied by the auxiliary RF output stage 54 may be used. As in the previous embodiments, it should be understood that the "DC" power on the second DC power rail 62 is unipolar and generally not time invariant direct current power.

The combiner 58 illustrated in FIG. 4 may be any device capable of combining the RF power supplied from each of the RF output stages 50, 54 and providing the combined RF output power on the RF power node 18. Similar to the concept of the previously discussed embodiments, the main RF output stage 50 provides coarse control of the RF output power supplied to the plasma processing chamber 12 (FIG. 1). In addition, the auxiliary RF output stage 54 provides fine control by providing fast and agile stabilizing modulation of the RF output power with relatively small amplitude adjustments. Further, the main RF output stage 50 may operate with relatively high efficiency and a frequency response capability at least one order of magnitude less than the frequency of the RF power. Conversely, the auxiliary RF output stage 54 may operate with relatively low efficiency and a frequency response capability up to the frequency of the RF power.

In one embodiment, the amplitude of the RF output power may be adjusted by phase modulation while maintaining the same RF frequency. Phase modulation may be accomplished by synchronizing and phase locking the frequency of the RF power generated by the first and second RF output stages 50, 54. Phase locking may occur at 0 degrees phase (boost) or 180 degrees phase (buck). Rotation of the phase of RF power supplied by the auxiliary RF output stage 54 with respect to the phase of RF power supplied by the main RF output stage 50 adjusts the amplitude of the RF output power.

By controlling the phase difference, the RF power supplied by the auxiliary RF output stage 54 may be added to, or subtracted from, the RF power supplied by the main RF output stage 50 in variable proportion. In another embodiment, the RF power supplied by the main RF output stage 50 and the auxiliary RF output stage 54 are both modulated to modulate the RF output power. In still other embodiments, other techniques for modulating the RF output power using the main RF output stage 50 and the auxiliary RF output stage 54 may be utilized.

The presently preferred embodiments of the RF generation system 16 may stabilize the plasma processing system 10 using feedback techniques. The main power source (main DC power supply 34 or main RF output stage 50) may provide the majority of the power with relatively high efficiency and relatively low frequency response. Conversely, the auxiliary power source (auxiliary DC power supply 36 or auxiliary RF output stage 54) may provide relatively high frequency response at relatively low efficiency. Through cooperative operation of the main and auxiliary power sources, the overall operation of the RF generation system 16 may be highly efficient with an effective control bandwidth that may operate from low frequencies to frequencies at the frequency of the RF wave. As a result of the expanded control bandwidth, unstable tendencies within the plasma processing system 10 that may lead to instability of the plasma discharge may be suppressed. Suppression of the instability may be achieved by the ability of the RF generating system 16 to adjust the RF output power fast enough to maintain the density of the plasma discharge in a metastable region around a desired operating point.

Prior art techniques for suppressing instabilities do not enjoy high efficiency operation in conjunction with the capability to operate with a control bandwidth up to the frequency of the RF wave. Accordingly, prior art techniques for RF power generation are unable to track and address plasma instabilities up to the frequency of the RF power being generated. In addition, the prior art does not include a relatively large, highly efficient, main power source in cooperative operation with a relatively small, lower efficiency, auxiliary power source to achieve wide bandwidth, small amplitude modulation of RF power.

The embodiments of the invention disclosed herein are presently considered to be preferred, however various changes and modifications can be made without departing from the spirit and scope of the invention. The scope of the invention is indicated in the appended claims, and all changes that come within the meaning and range of equivalents are intended to be embraced therein.

What is claimed is:

1. An RF generating system for supplying RF output power, the RF generating system comprising:
   an RF power node;
   a main power source electrically coupled with the RF power node, the main power source operable to supply power to the RF power node that is utilized in the generation of RF output power; and
   an auxiliary power source electrically coupled with the RF power node, the auxiliary power source operable to supplement the power supplied by the main power source.

2. The RF generating system of claim 1, further comprising an RF output stage electrically coupled with the main power source, the auxiliary power source and the RF power node, wherein the RF output stage is operable to generate RF output power on the RF power node as function of the power supplied by the main power source and the auxiliary power source.

3. The RF generating system of claim 2, wherein the main power source comprises a switch-mode DC power supply and the auxiliary power source comprises a linear DC power supply.

4. The RF generating system of claim 2, wherein the power supplied by the main and auxiliary power sources DC power.

5. The RF generating system of claim 1, further comprising a combiner electrically coupled with the main power source, the auxiliary power source and the RF power node, wherein the combiner is operable to generate the RF output power on the RF power node as function of power supplied by the main power source and the auxiliary power source.

6. The RF generating system of claim 5, wherein the main power source is a main RF output stage comprising a switch-mode power supply, and the auxiliary power source is an auxiliary RF output stage comprising an amplitude agile power amplifier.

7. The RF generating system of claim 5, wherein the power supplied by the main and auxiliary power source comprises RF power.

8. The RF generating system of claim 1, wherein the main power source supplies power as a function of an operating point of the RF generating system and the auxiliary power source supplies power as a function of a feedback signal.

9. The RF generating system of claim 1, further comprising an impedance matching network and a plasma processing chamber, the impedance matching network and the plasma processing chamber electrically coupled with the RF power node.

10. An RF generating system for supplying RF output power, the RF generating system comprising:
  an RF output stage;
  a first power supply electrically coupled with the RF output stage, the first power supply operable to supply DC power to the RF output stage; and
  a second power supply electrically coupled with the firs power supply and the RF output stage, the DC power selectively adjustable by the second power supply.

11. The RF generating system of claim 10, wherein the frequency response capability of the first power supply is at least an order of magnitude less than the frequency response capability of the second power supply.

12. The RF generating system of claim 10, wherein the first power supply is operable to modulate the DC power at frequencies in a range that is at least an order of magnitude less than the frequency of the RF power.

13. The RF generating system of claim 12, wherein the second power supply is operable to adjust the DC power at frequencies in a range up to the frequency of the RF power.

14. The RF generating system of claim 10, wherein the first power supply is operable to supply a magnitude of DC power to the RF output stage to create a desired amplitude of RF output power.

15. The RF generating system of claim 14, wherein the second power supply is operable to supply a magnitude of DC power that is at least an order of magnitude less than DC power supplied by the first DC power supply.

16. The RF generating system of claim 10, wherein the first power supply is operable to modulate the DC power as a function of an RF setpoint.

17. The RF generating system of claim 16, wherein the second power supply is operable to adjust the DC power as a function of a feedback signal, the feedback signal indicative of stability.

18. The RF generating system of claim 10, wherein the RF output power is supplied to a load, the load comprising a plasma discharge.

19. The RF generating system of claim 10, wherein first power supply is a switch-mode power amplifier.

20. The RF generating system of claim 19, wherein the second power supply is a broad band power amplifier.

21. The RF generating system of claim 10, wherein the first power supply is electrically connected in series with the second power supply.

22. The RF generating system of claim 10, wherein the first power supply is electrically connected in parallel with the second power supply.

23. An RF generating system for processing plasma, the RF generating system comprising:
  an RF output stage operable to generate RF output power,
  a DC rail electrically coupled with the RF output stage;
  a switch-mode DC power supply electrically coupled with the DC rail, the switch-mode DC power supply operable as a main power supply to modulate the magnitude of DC power on the DC rail as a function of an RF setpoint; and
  a linear DC power supply electrically coupled with the DC rail, the linear DC power supply operable as an auxiliary power supply to buck and boost the DC power on the DC rail as a function of a feedback signal.

24. The RF generating system of claim 23, wherein the RF output stage comprises a switch-mode power amplifier.

25. The RF generating system of claim 23, wherein the RF setpoint comprises a desired amplitude of RF power representing an operating point of the RF generating system.

26. The RF generating system of claim 25, wherein the feedback signal is indicative of instabilities related to the plasma.

27. The RF generating system of claim 23, wherein the feedback signal is indicative of instabilities related to the RF output power.

28. The RF generating system of claim 23, wherein the switch-mode DC power supply is operable to modulate the amplitude of the RF output power at a frequency less than or equal to about 2 MHz.

29. The RF generating system of claim 28, wherein the linear DC power supply is operable to modulate the amplitude of the RF output power at frequencies beyond the bandwidth of the witch-mode DC power supply up to the frequency of the RF output power.

30. The RF generating system of claim 23, further comprising a controller, the controller operable to perform coarse control of the amplitude of the RF output power as a function of the switch-mode DC power supply.

31. The RF generating system of claim 23, further comprising a controller, the controller operable to perform fine control of the amplitude of the RF output power as a function of the linear DC power supply.

32. The RF generating system of claim 23, further comprising a sensor, the sensor operable to provide the feedback signal, wherein the feedback signal is indicative of instabilities related to a load supplied by the RF output power.

33. An RF generating system for generating RF output power to process plasma, the RF generating system comprising:
  a first RF output stage;
  a second RF output stage in operable cooperation with the first RF output stage; and
  a combiner electrically coupled with the first RF output stage and the second RF output stage, the combiner operable to combine RF power supplied by the first RF output stage and the second RF output stage to generate RF output power.

34. The RF generating system of claim 33, wherein the first RF output stage comprises a switch-mode power amplifier.

35. The RF generating system of claim 34, wherein the second RF output stage comprises one of a linear power amplifier and a quasi-linear power amplifier.

36. The RF generating system of claim 33, wherein the first RF output stage is operable to provide an amplitude of RF power as a function of an RF setpoint.

37. The RF generating system of claim 33, wherein the second RF output stage is operable to adjust the RF power provided by the first RF output stage.

38. The RF generating swan of claim 33, wherein the RF power supplied by the second RF output stage is added and subtracted from RF power supplied by the first RF output stage as a function of phase rotation of the RF power of the second RF output stage relative to the RF power of the first RF output stage.

39. The RF generating system of claim 33, wherein the frequency response capability of the second RF output stage is at least one order of magnitude larger than the frequency response capability of the first RF output stage.

40. A method of supplying RF output power, the method comprising:
  a) generating RF output power;
  b) coarsely controlling the RF output power to an operating point represented as an RF setpoint as a function of power supplied by a main power source; and c) modulating the RF output power in a metastable region surrounding the operating point to finely control the RF output power as a function of power supplied by an auxiliary power source.

41. The method of claim 40, further comprising:

d) monitoring a signal from a sensor; and c) performing c) as a function of the signal.

42. The method of claim 40, wherein b) comprises modulating the amplitude of the RF output power at frequencies at least one order of magnitude less than the frequency of the RF output power.

43. The method of claim 42, wherein c) comprises modulating the RF output power at frequencies up to the frequency of the RF output power.

44. The method of claim 40, wherein b) comprises supplying power that is DC power to an RF output stage to create a desired amplitude of RF output power.

45. The method of claim 44, wherein c) comprises supplying power that is DC power to buck and boost the DC power supplied by the first power supply.

46. The method of claim 40, wherein b) comprises supplying power that is RF power to a combiner to create a desired amplitude of RF output power.

47. The method of claim 46, wherein c) comprises rotating the phase of RF power supplied by the second power supply with respect to the RF power supplied by the first power supply.

48. A method of supplying RF output power to process plasma, the method comprising:

a) generating RF output power with an RF output stage; and b) controlling the amplitude of the RF output power with DC power supplied to the RF output stage by a first power supply in combination with a second power supply.

49. The method of claim 48, wherein b) comprises:

modulating the DC power with the first power supply at frequencies at least one order of magnitude less thin the frequency of the RF power; and modulating the DC power with the second power supply at frequencies up to the frequency of the RF output power.

50. The method of claim 48, further comprising controlling the magnitude of DC power supplied by the first power supply as a function of a desired amplitude of RF power.

51. The method of claim 50, further comprising controlling the magnitude of DC power supplied by the second power supply as a function of the stability of a load coupled with the RF output stage.

* * * * *

UNITED STATES PATENT AND TRADEMARK OFFICE
CERTIFICATE OF CORRECTION

PATENT NO. : 6,920,312 B1  Page 1 of 1
DATED : July 19, 2005
INVENTOR(S) : Neil Benjamin It is certified that error appears in the above-identified patent and that said Letters Patent is hereby corrected as shown below:

Title page,
Item [56], References Cited, U.S. PATENT DOCUMENTS, delete "8,109,206" and insert -- 6,109,206 --.

Column 14,
Line 43, after "sources" insert -- comprises --.

Column 15,
Line 7, delete "firs" and insert -- first --.
Line 52, delete "power," and insert -- power; --.

Column 16,
Line 14, delete "witch-mode" and insert -- switch-mode --.
Line 52, delete "swan" and insert -- system --.

Column 17,
Line 7, delete the first appearance of "c)" and insert -- e) --.

Column 18,
Line 13, delete "thin" and insert -- than --.

Signed and Sealed this

Fourth Day of October, 2005

JON W. DUDAS
*Director of the United States Patent and Trademark Office*